United States Patent
Thakur (10) Patent No.: US 6,475,927 B1
(45) Date of Patent: Nov. 5, 2002

(54) METHOD OF FORMING A SEMICONDUCTOR DEVICE

(75) Inventor: Randhir P. Thakur, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/017,453

(22) Filed: Feb. 2, 1998

(51) Int. Cl.⁷ .................. H01L 21/31; H01L 21/469
(52) U.S. Cl. .............. 438/773; 438/770; 438/787; 438/264; 438/287
(58) Field of Search .................. 438/773, 770, 438/787, 264, 287, 771, 788, 906, 974

(56) References Cited

U.S. PATENT DOCUMENTS

| | | | |
|---|---|---|---|
| 4,271,421 A | * 6/1981 | McElroy | 357/41 |
| 5,022,961 A | 6/1991 | Izumi et al. | 156/646 |
| 5,078,832 A | 1/1992 | Tanaka | 156/639 |
| 5,178,682 A | * 1/1993 | Tsukamoto et al. | 118/722 |
| 5,188,979 A | 2/1993 | Filipiak | 437/192 |
| 5,326,406 A | 7/1994 | Kaneko et al. | 134/1 |
| 5,344,365 A | 9/1994 | Scott et al. | 454/187 |
| 5,589,422 A | * 12/1996 | Bhat | 437/228 |
| 5,610,854 A | 3/1997 | Ema | 365/149 |
| 5,613,821 A | 3/1997 | Muka et al. | 414/217 |
| 5,693,578 A | 12/1997 | Nakanishi et al. | 437/238 |
| 5,876,788 A | 3/1999 | Bronner et al. | 427/81 |
| 6,156,121 A | 12/2000 | Hasebe et al. | 118/500 |
| 6,240,933 B1 | * 6/2001 | Bergman | 134/1.3 |
| 6,265,286 B1 | * 7/2001 | Boyer et al. | 438/443 |

FOREIGN PATENT DOCUMENTS

| | | | |
|---|---|---|---|
| JP | 59-28369 | 2/1984 | H01L/27/04 |
| JP | 5-267684 | 10/1993 | H01L/29/788 |

* cited by examiner

*Primary Examiner*—Alexander Ghyka
(74) *Attorney, Agent, or Firm*—Charles Brantley (57) ABSTRACT

In the formation of semiconductor devices, a processing method is provided, including steps for forming an oxide layer. The embodied methods involve a series of oxidation steps, with optional interposed cleanings, as well as an optional conditioning step after oxidation. In a preferred embodiment, these steps are clustered and transportation between the clustered process chambers takes place in a controlled environment such as nitrogen or a vacuum. In some embodiments, the method provides an oxide layer to be used as part of the device, such as a tunnel oxide for a flash-EEPROM, or as a general gate oxide. Alternatively, the steps can be used to sculpt through oxidation various levels of a substrate, thereby allowing for embedded memory architecture. Cleaning between oxidation steps offers the advantage of providing a more defect-free oxide layer or providing access to a more defect-free level of substrate.

3 Claims, 7 Drawing Sheets

METHOD OF FORMING A SEMICONDUCTOR DEVICE

TECHNICAL FIELD

The present invention relates to the formation of semiconductor devices. More particularly, the present invention relates to the formation of an oxide layer as part of a device or as used in the fabrication of the device.

BACKGROUND OF THE INVENTION

In the semiconductor industry, oxide films are used in a variety of applications. Oftentimes they are used for scratch protection and passivation purposes. Oxide films are also used as a dielectric or insulative layer, electrically separating various regions or structures. For example, an oxide film can be used as a dielectric between different levels of metal in a semiconductor device. Such a film could also be used for field isolation. Moreover, an oxide film can serve as a gate oxide, wherein the film is provided above an area, such as a semiconductor substrate, having a source region, a drain region, and an interposing channel region. A gate, in turn, is formed on the oxide film. As a result, the voltage applied to the gate must reach a particular threshold before overcoming the insulative effects of the oxide and allowing current to flow through the channel. When used as field isolation, an oxide is formed in order to electrically insulate one device, such as a transistor, from another.

Whether for field isolation purposes or for application in the gate stack of a transistor, providing the oxide typically begins by exposing designated oxide regions of a substrate to an oxidizing ambient through a patterned mask. The mask may be made, for example, of silicon nitride. For purposes of explaining the current invention, it is assumed that the substrate represents the surface of a wafer and is comprised generally of silicon. Nevertheless, this invention is understood to cover devices having a substrate comprising any construction made of semiconductive material, including but not limited to bulk semiconductive materials such as a semiconductor wafer (either alone or in assemblies comprising other materials thereon) and semiconductive material layers (either alone or in assemblies comprising other materials). Upon exposure to the oxidizing ambient, the unprotected portions of the silicon substrate oxidize into silicon dioxide ($SiO_2$). The silicon at and below the surface of the substrate that oxidizes is often referred to as having been "consumed." It follows that the amount of silicon consumed can indicate the depth of $SiO_2$ beneath the substrate's original surface. As a result, greater consumption allows for a greater depth of $SiO_2$ and, thus, greater electrical isolation between devices or between active areas within a device.

The consuming effect of oxide films on silicon serves other purposes as well. For example, greater consumption in a particular area of the wafer allows access to a lower level of silicon within the substrate. Accordingly, removing the oxide results in a wafer topography having different elevations of silicon, depending upon the amount of prior oxidation in each area. This is particularly helpful in embedded dynamic random access memory (DRAM) processing, wherein the memory cell array should be embedded deeper within the wafer than other memory elements.

Oxidizing the exposed substrate, as discussed above, is often referred to as "growing" the oxide. Oxides can be grown in a "dry" process using oxygen ($O_2$) or in a "wet" process using steam as the oxidizing agent. As an alternative to growing, oxides can be deposited on the substrate with techniques such as sputter deposition or chemical vapor deposition (CVD).

Oxide layers have a large impact on device performance due to their role in isolating active device regions and in establishing voltage thresholds for devices. Thus, there is always a need in the art for high quality oxide films. Further, as the dimensions of semiconductor devices are scaled down to enhance circuit density and speed, the oxide films must advance accordingly. Therefore, those skilled in the art are constantly striving to provide oxide films that are thinner and that have a high dielectric constant.

However, during the deposition or growth of oxides, defects in the oxide can occur due to the presence of certain constituents within the layer, such as contaminants exposed to the oxide. For example, particulate matter in the process atmosphere is one source of contamination. Even when the oxide or other layers are developed in a "clean room" environment, wherein filters and other techniques attempt to remove particles from the environment, particles that are too small for these techniques to handle may nevertheless end up within the oxide layer. Further attempts at reducing defects have been made by clustering together the chambers for several wafer processes in an environment isolated from and even more controllable than the clean room atmosphere. Transferring the wafers between the clustered chambers can involve the use of a wafer carrier capable of maintaining a vacuum or a nitrogen atmosphere. See, for example, U.S. Pat. No. 5,613,821 and U.S. Pat. No. 5,344,365. Nonetheless, there is a constant need in the art for further lowering the number of defects in oxide films, including a need for methods of handling contaminants that find their way to the wafer despite the controlled environment.

SUMMARY OF THE INVENTION

Accordingly the current invention concerns methods for providing an oxide layer during the processing of a semiconductor device. One exemplary embodiment relates to a method wherein an oxide is provided on a substrate surface and is then subjected to a cleaning process, followed by a provision of still more oxide. The oxide in either step could be grown or deposited. Moreover, the cleaning step may be used to remove all or some of the first provision of oxide. This embodiment has the advantage of removing any oxide that may carry constituents such as contaminants that were part of the underlying substrate. Thus, this embodiment can be used to provide a more contaminant free oxide for a semiconductor device. Alternatively, this embodiment can be used to selectively consume portions of a substrate, thereby allowing memory structures such as embedded memories to be formed within the lower elevations of the substrate.

Another exemplary embodiment allows for providing a gate dielectric having a high dielectric constant. Such dielectrics include oxides such as tantalum pentoxide ($Ta_2O_5$), or layers produced through rapid thermal nitridation (RTN), such as oxynitrides. In this embodiment, a layer of oxide or oxynitride serves as an adhesion layer between the substrate and the subsequently deposited $Ta_2O_5$. A cleaning step between providing the adhesion layer and providing the $Ta_2O_5$ layer is optional. One advantage of this embodiment is that leakage current can be improved.

Yet another exemplary embodiment covers a range of steps for processing the semiconductor device, including a vapor clean, an initial oxide growth or deposition, a subsequent oxide growth or deposition, an optional second vapor clean between the two oxide steps, an oxide hardening, and the formation of an electrode over the second oxide. In a more preferred version of this embodiment, these steps are clustered, wherein transportation between the various processes are performed in a common controlled environment, such as a nitrogen atmosphere or a vacuum. The cluster process environment lowers the amount of contaminants having access to the in-process semiconductor device, and the cleaning steps help to negate the effects of any contaminants that appear within the device despite the attempts to control the environment.

DETAILED DESCRIPTION OF THE PREFERRED EMBODIMENTS

Figure 1:
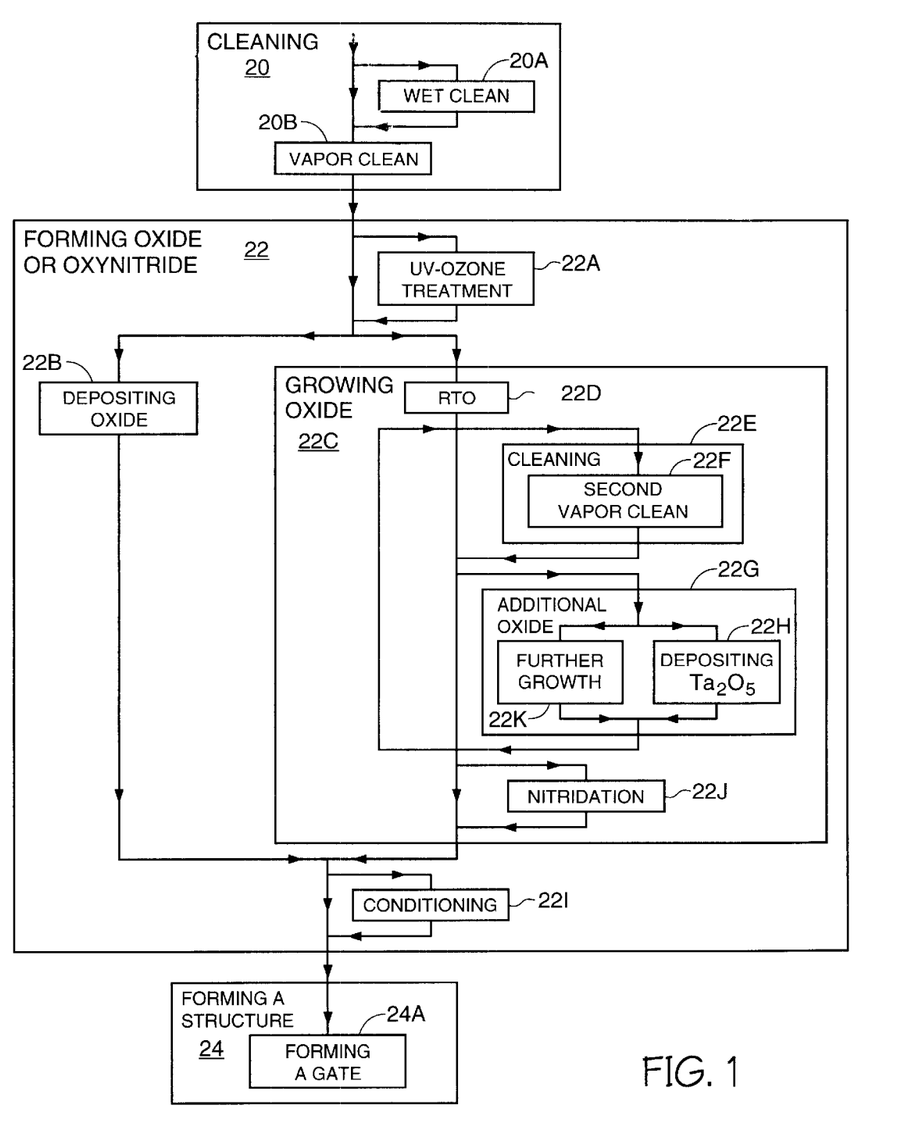
FIG. 1 is a process flow diagram of one exemplary embodiment of the present invention.

As seen in FIG. 1, at least one embodiment of the current invention comprises a cleaning stage 20, a stage involving forming an oxide (or an oxynitride) 22, and a stage of forming a structure 24. These basic stages, 20, 22, and 24, further comprise more detailed steps. For example, cleaning stage 20 includes a vapor clean 20b. In many cases this vapor clean 20b is performed in at least five seconds and occurs at a temperature ranging between 50° and 75° C. This vapor clean 20b may take the form of an ultraviolet-chlorine clean, wherein ultraviolet light excites and dissociates a gas containing chlorine. As a result, chlorine radicals are generated. These chlorine radicals act as gettering agents, penetrating the oxide layer and bonding with constituents therein, such as contaminants. These radicals are particularly useful in neutralizing the harm caused by metallic constituents within an oxide layer. This ultraviolet-chlorine clean generally takes between ten and sixty seconds and may occur at pressures less than, greater than, or equal to 760 torr. The temperature for this process is generally between 50° and 150° C. but is preferably between 60° and 80° C.

Alternatively, the vapor clean 20b may comprise an HF vapor clean. As one example of the parameters needed for an HF vapor clean, the pressure should be 1mtorr, the temperature should be less than 200° C., and the exposure to HF should last five to ten seconds. The pH can be established at any level between 1 and 10. Still other alternatives include using tetramethylammonium hydroxide (TMAH) in the vapor clean process to assist in cleaning. For purposes of explaining the current invention, the TMAH is assumed to have a pH of 3, although one of ordinary skill in the art can appreciate that the pH level can vary according to the particular passivation requirements of a given embodiment. Also for purposes of explanation, it is assumed that a wafer is undergoing the methods of the current invention, although this is not required to practice the invention, as individual devices could also be processed. In general, the cleaning stage helps to remove residue from etches executed earlier in the device-formation process.

As a part of the cleaning stage 20, an optional wet clean 20a may be performed in addition to the vapor clean 20b. Preferably, the wet clean 20a is performed before the vapor clean 20b. This wet clean step 20a may be an RCA clean, which involves cleaning solutions developed by RCA. These solutions employ hydrogen peroxide chemistry, the two most common solutions being "standard clean 1" (SC-1) and "standard clean 2" (SC-2). The solution SC-1 typically comprises ammonium hydroxide, hydrogen peroxide, and deionized water in the following volume ratio: $1NH_4OH:1H_2O_2:5H_2O$. The solution SC-2 generally has the following composition: $6H_2O:1H_2O_2:1HCl$. Typically wafers are immersed in the RCA cleaning solutions for 10 minutes at 20° to 80° C. for each solution, with deionized water rinses between immersions. There is also a final deionized water rinse after all immersions. The wet clean 20a serves to passivate the wafer by allowing for a termination of the silicon surface with hydrogen atoms. In this way, a hydrophilic or a hydrophobic surface can be prepared.

Once the wafer surface has been cleaned, it is ready for oxide or oxynitride formation, as indicated by stage 22. In many embodiments, this stage 22 initially involves growing an oxide on the wafer surface 22c, which consumes the silicon down to a particular level within the substrate. However, the current invention includes embodiments wherein oxide is deposited 22b at the initiation of this stage 22.

In at least one embodiment, oxide growth can be accomplished through a rapid thermal oxidation (RTO) process 22d at a temperature generally ranging from 800° to 1100° C. This RTO process 22d is carried out until it has produced an oxide thickness of at least generally 10 angstroms.

In addition to this initial step of growing an oxide, there are additional steps which may take place to enhance the oxide formation stage 22. For instance, after the vapor clean 20b has been performed, yet before the RTO process 22d begins, it may be beneficial to induce chemical oxide growth on the wafer through an ultraviolet-ozone treatment 22a, wherein ultraviolet radiation is used to enhance the oxidation rate of the silicon substrate in an ozone environment. This treatment 22a is preferably carried out long enough to provide a high-quality oxide layer having a thickness generally ranging from 10 to 15 angstroms. Regardless of whether the oxide is provided in one step or a plurality of steps, it is preferable to have approximately 30 to 40 angstroms of oxide once step 22d has been completed.

Once the ultraviolet-ozone treatment 22a and the RTO process 22d have been performed, there is an option to provide additional amounts of oxide 22g. Further growth 22k from the consumption of silicon may be used to provide oxide similar to that resulting from the initial growth. Alternatively, an oxide, such as $Ta_2O_5$ (22h), could be deposited. Regardless of the precise methods of providing oxides in these steps 22d, 22a, and 22g, they are understood to cooperate in achieving a given thickness of oxide at the end of the oxide formation stage 22. Thus, a greater oxide contribution in one step may relieve the need to produce more oxide in other steps. This "given thickness" of oxide varies depending on the structures formed, as one skilled in the art can appreciate. Exemplary thicknesses are discussed below.

Achieving this given thickness of oxide is further aided by an optional additional cleaning step 22e, such as a second vapor clean 22f performed after an oxidation step and, preferably, interposed between oxidation steps such as 22d and 22g. As a result of this vapor clean 22f, some or all of the oxide present may be removed. If a gate dielectric such as $Ta_2O_5$ is deposited, some of the oxide provided in a prior step should remain to act as an adhesion layer between the substrate and the gate dielectric. In addition to curing any problems that might result from an inadvertent overgrowth of oxide, this second vapor clean 22f also serves to remove defects that would otherwise exist in the finished device. Defective oxides can arise if there are certain constituents, such as contaminants, in the silicon from which the oxide grows. As the silicon is consumed in steps such as 22d and 22a, the resulting oxide may retain those contaminants. By removing all or part of this grown oxide, the second vapor clean 22f also removes those contaminants associated with the removed oxide.

Figure 2A:
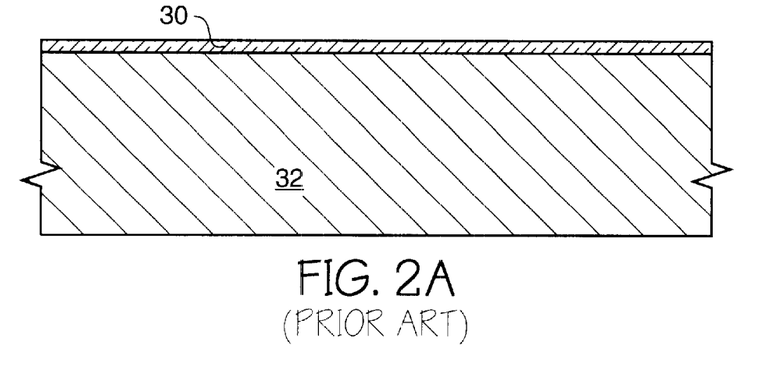
FIGS. 2a through 2e illustrates a prior art process for forming an embedded DRAM.
Figure 2B:
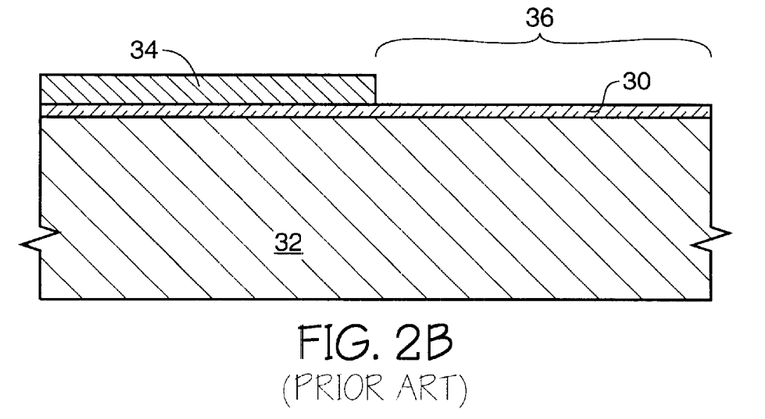
Figure 2C:
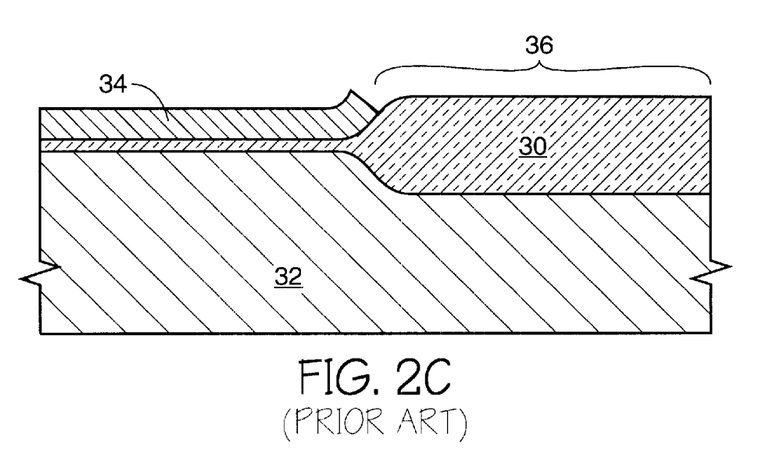
Figure 2D:
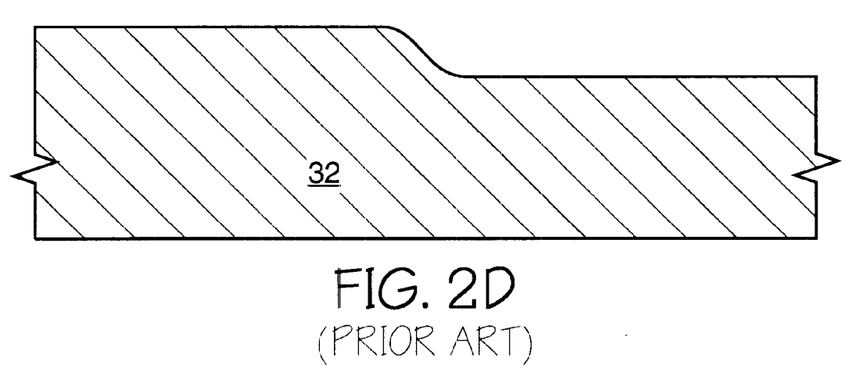
Figure 2E:
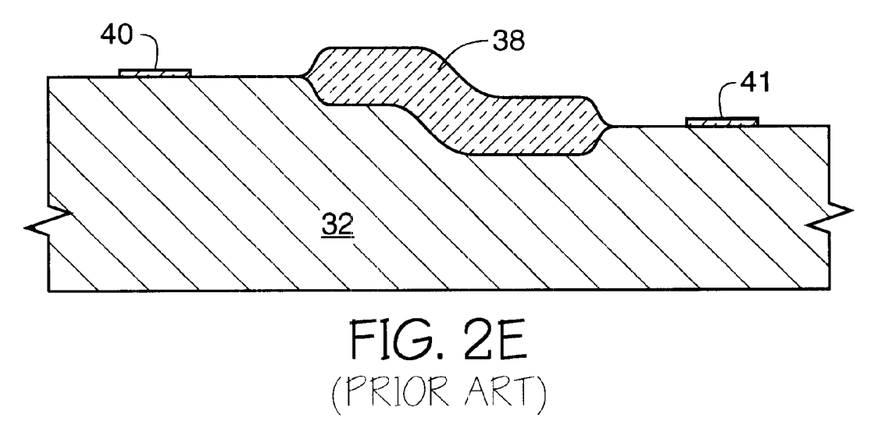

While the amount of oxide at the end of this stage 22 may have a generally constant thickness, such a limitation is not necessary for the present invention. In fact, providing for variations in oxide thickness is actually desired in certain circumstances, such as in providing the topography needed for embedded DRAM memory devices. FIG. 2 illustrates how this topography is achieved in the prior art. As seen in FIG. 2a, a thin layer of $SiO_2$ 30 is grown on the silicon substrate 32. FIG. 2b indicates that the $SiO_2$ layer 30 is then covered with a mask layer 34, such as one made of silicon nitride. The mask layer 34 is patterned to expose an area 36 where further oxide growth is desired. Additional oxide growth is then carried out in FIG. 2c, resulting in more silicon being consumed in the exposed area 36, while most of the $SiO_2$ layer 30 under the silicon nitride mask 34 retains its original thickness. In FIG. 2d, the mask 34 and $SiO_2$ layer 30 are removed, leaving behind a bi-level topography for the substrate 32. It is preferred that the resulting levels be parallel, but differences in slopes are allowable to the extent that the devices would still be functional. Further oxidation and masking steps are carried out to form structures such as the field oxide isolation regions 38 and gate oxide regions 40 and 41 depicted in FIG. 2e. This prior art method, however, depends on the higher levels of the substrate 32 being relatively free of constituents such as contaminants. Should the substrate 32 be contaminated in an area under the mask layer 34, then the gate oxide 40 formed by consuming silicon in that area will also be contaminated.

Figure 3A:
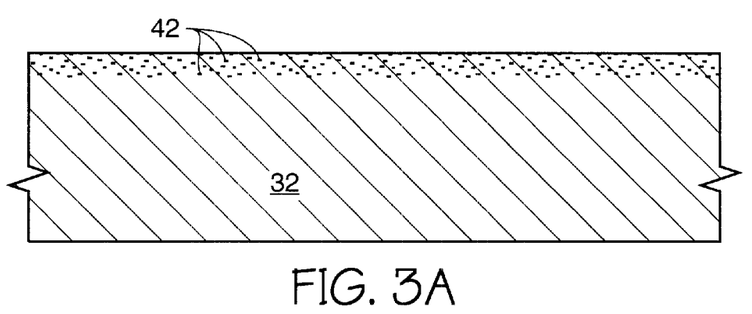
FIGS. 3a through 3c depicts a second exemplary embodiment of the current invention.
Figure 3B:
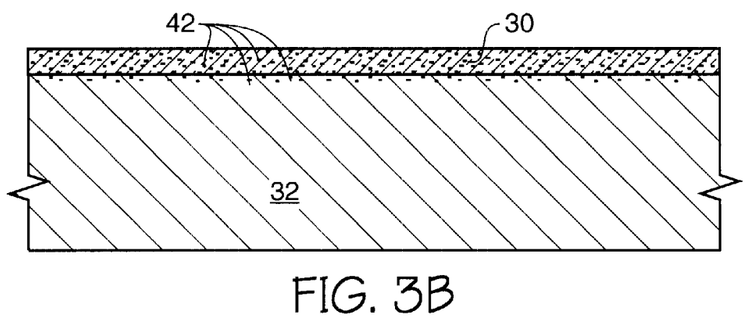
Figure 3C:
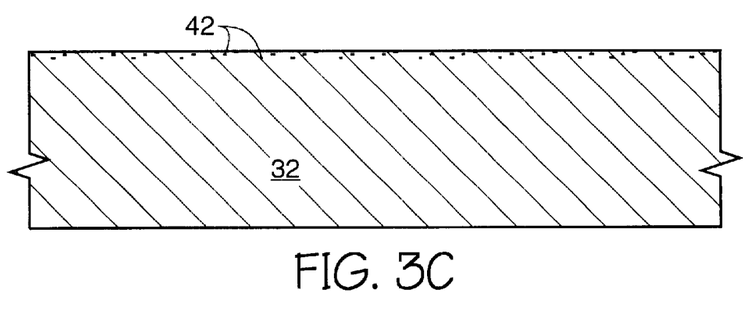

At least one embodiment of the current invention is free of such dependency. FIG. 3a depicts the unoxidized substrate 32 having contaminants 42. Some of these contaminants 42 become part of the grown $SiO_2$ layer 30 after oxidation, as depicted in FIG. 3b. The effect of the second vapor clean step 22f, shown in FIG. 1, can be seen in FIG. 3c, wherein the $SiO_2$ layer 30, along with its associated contaminants 42, is removed. Subsequent oxidation, masking, and removal steps may then be taken to achieve the bi-level topography needed for embedded DRAM devices. Assuming some contaminants 42 remain in the substrate 32, the subsequent oxidation and removal steps will preferably eliminate most if not all of these contaminants 42.

Figure 4A:
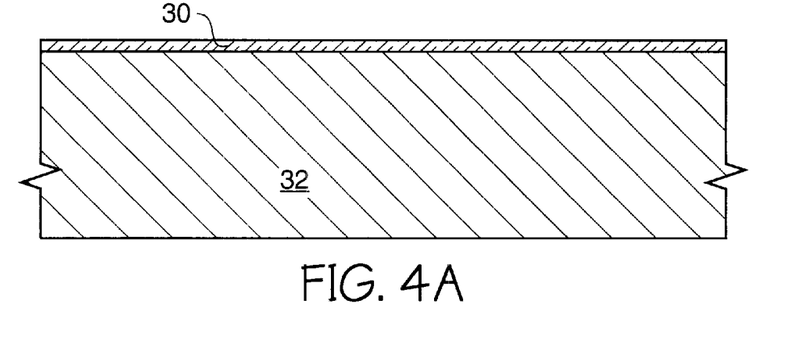
FIGS. 4a through 4e demonstrates a third exemplary embodiment of the current invention.
Figure 4B:
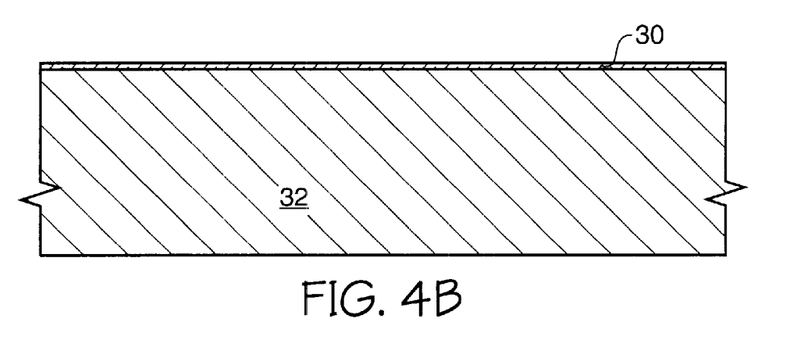
Figure 4C:
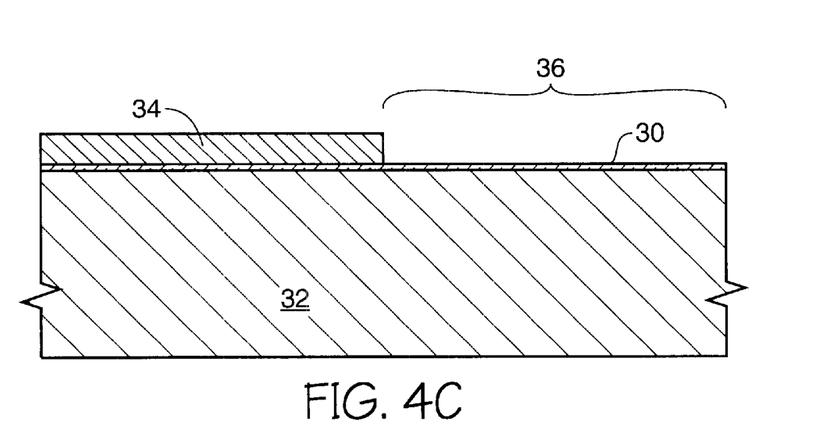
Figure 4D:
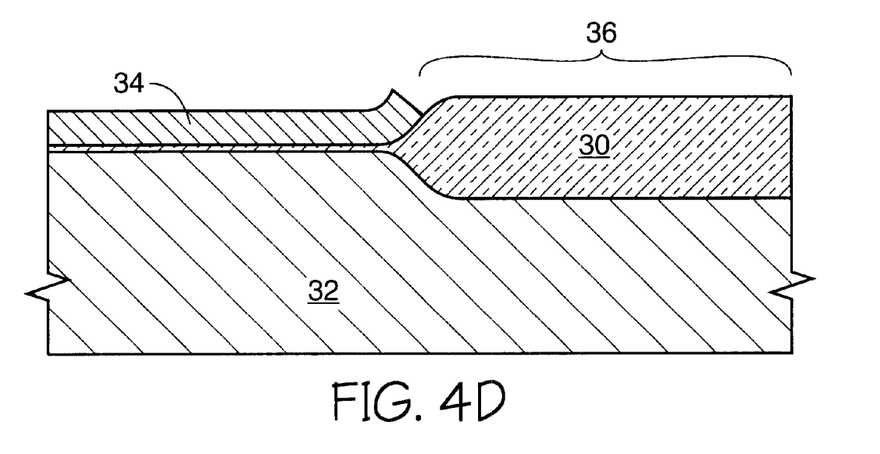
Figure 4E:
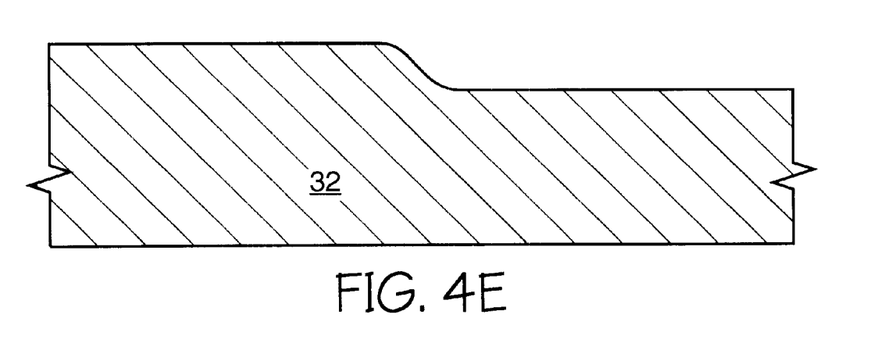

Moreover, it is not necessary to completely remove the initial $SiO_2$ layer 30, as shown in the embodiment depicted in FIGS. 4a through 4e. FIG. 4a once again shows the substrate 32 with the $SiO_2$ layer 30 grown on top. FIG. 4b depicts the in-process wafer after the second vapor clean 22f, wherein only part of the $SiO_2$ layer 30 has been removed as a result of that cleaning. Preferably, this partial oxide removal or subsequent oxide removals will eliminate most if not all of any existing contaminants or other undesired constituents within the $SiO_2$ layer. Assuming an exemplary embedded memory topography is desired, it is preferred that approximately 40 angstroms of the $SiO_2$ layer 30 remain after the second vapor clean 22f. The mask layer 34 is then provided and patterned to expose the area 36. If desired, further cleaning steps could be taken to remove more of the exposed $SiO_2$ layer 30 before additional oxide is grown. Alternatively, one may retain the existing $SiO_2$ layer and continue to grow more oxide, as demonstrated in FIG. 4d. Regardless of whether this latest cleaning is performed, it is preferred that the final thickness of the $SiO_2$ layer 30 in the exposed area 36 be within a range of approximately 70 to 90 angstroms for this exemplary embedded memory structure. Removing the $SiO_2$ layer 30 and the mask layer 34 reveals the bi-level topography of the wafer of FIG. 4e. Field oxide regions and gate oxide regions may then be formed by the oxidation/cleaning steps described in the above embodiments or by a method known in the art.

If an oxynitride layer is desired, then a nitridation step 22j (seen in FIG. 1) may be performed on the oxide layer. One possible way to carry out this step 22j involves rapid thermal nitridation (RTN), wherein ammonia ($NH_3$) is introduced to the wafer environment and heated with a source, such as a halogen lamp, to a temperature generally ranging from 850° to 1050° C. As a result of this process, the oxide film is rapidly changed to an oxynitride film.

Regardless of the particular devices being developed on the wafer, once the correct amount of oxide or oxynitride is present, an optional conditioning step 22i may be performed. In at least one embodiment, this conditioning step 22i comprises hardening the oxide in a nitridizing ambient, such as NO or $N_2O$. In other embodiments, particularly those involving high dielectric constant materials such as $Ta_2O_5$, the conditioning step can alternatively include exposure to an ambient comprised of $NH_3$; dichlorosilane ($SiCl_2H_2$) and $NH_3$; an oxygen environment, such as ozone; $N_2$; Ar; or $H_2$. This exposure would last for at least ten seconds at preferably five to fifteen atmospheres and at a temperature generally between 500° to 750° C. Another conditioning alternative involves steam oxidation, wherein the dielectric is exposed to a mixture of $H_2$ and $O_2$. Those skilled in the art understand that such a mixture may be generated by using a plasma torch. The current invention, however, also includes a conditioning step wherein a plasma torch is not used; rather, $H_2$ and $O_2$ are brought together within the process chamber at a pressure of generally one atmosphere or lower and at a temperature generally ranging from 500° to 900° C.

Figure 5:
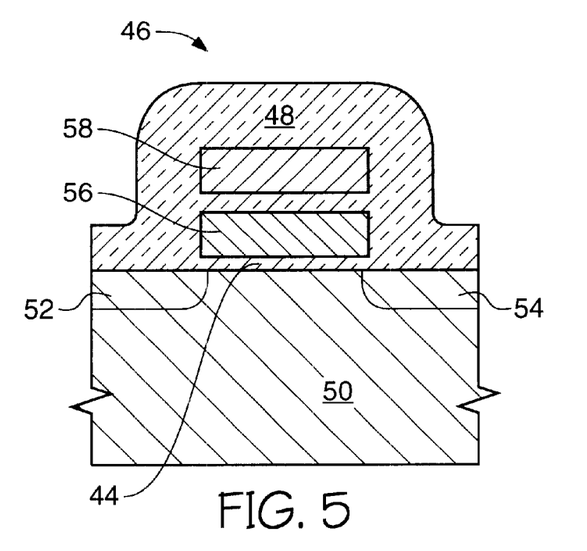
FIG. 5 shows a portion of a flash-electrically erasable programmable read only memory.

If an embodiment of the current invention is used to provide a gate oxide, one advantage will be to reduce the current leakage of a device or, at least, counteract factors that could increase the leakage. Moreover, the cleaning, oxidizing, and conditioning steps described above have uses in addition to altering the topography of the silicon substrate and to providing some form of gate oxide. These steps, for example, can be used to form the tunnel oxide 44 of a flash memory cell 46 depicted in FIG. 5, as well as the entire oxide 48 for that cell 46. The flash memory cell 46 pictured is more specifically a flash-electrically erasable programmable read only memory (flash-EEPROM) cell formed in a p-type substrate 50 having n-type source and drain regions 52, 54. Over the substrate 50, a floating gate 56 is provided within the oxide 48. A control gate 58 is also within oxide 48 and is located over the floating gate 56. The floating gate 56 is separated from the substrate by the tunnel oxide 44. This tunnel oxide 44 is a relatively thin oxide layer; while it can be as thin as thirty to forty angstroms, it is preferably closer to seventy to one hundred angstroms thin. The tunnel oxide 44 is so named because memory programming and erasing is accomplished by way of Fowler-Nordheim tunneling through this tunnel oxide 44. Thus, through an embodiment of the current invention, the tunnel oxide 44 could be provided through an initial oxidation step with a cleaning to reduce the oxide to a desired thickness. Alternatively, the oxide could be completely cleaned away, allowing a subsequent oxidation step to form the tunnel oxide 44 at a lower level of the substrate 50. The rest of the oxide 48 could be formed by an additional oxidation step or by still more oxidation/cleaning cycles.

Figure 6:
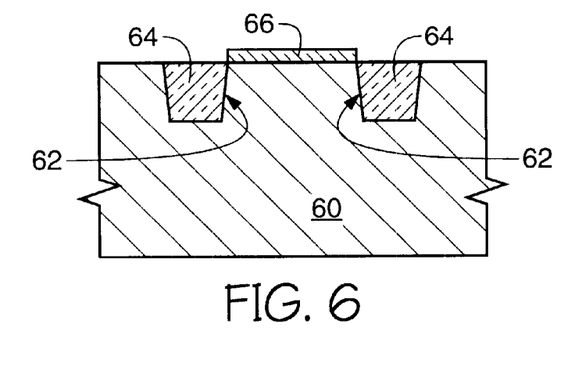
FIG. 6 illustrates an in-process semiconductor device that is electrically isolated using a shallow trench isolation process.

As another example, these cleaning, oxidizing, and conditioning steps can be used to provide a gate oxide for devices isolated using a shallow trench isolation (STI) process. Such a device in-progress appears in FIG. 6, wherein an etched substrate 60 defines trenches that electrically isolate one cell site from another. After providing a trench fill 64, the gate oxide 66 is grown in a high-pressure oxidation environment using the steps described above. For instance, the gate oxide 66 could be grown at a pressure generally ranging from five to fifteen atmospheres.

Given these varying environments for the oxide, the specific steps taken within the stage of forming a structure 24 will depend in part on the context in which the oxide is formed—such as whether it is formed for a gate in an embedded DRAM or to sculpt the substrate to accommodate such a gate, for a floating gate in a tunnel oxide, for a gate in an STI cell, or for other structures. In many instances, the stage of forming a structure 24 will involve a step of forming a gate 24*a* which, in turn, is often formed by depositing a polysilicon film. Moreover, a silicon-germanium film may be provided as an option by doping the polysilicon film with germanium, wherein the germanium concentration may generally range from 2% to 25%. Other alternatives to depositing polysilicon include depositing tantalum nitride, titanium nitride, and tungsten nitride.

Once the stage of forming a structure 24 has been completed, the wafer may undergo further processing, such as steps taken to form word lines. It should also be noted that, in a preferred embodiment, it is desirable to cluster the steps from the first vapor clean 20*b* to the stage involving forming a structure 24. Of course, in an even more preferred embodiment, every step would be clustered. This would serve to further reduce the constituents such as contaminants that might appear in an oxide as well as other layers.

Finally, one skilled in the art can appreciate that, although specific embodiments of this invention have been described above for purposes of illustration, various modifications may be made without departing from the spirit and scope of the invention. For example, providing oxide under the current invention is not limited to at most two oxidation steps; any number of oxidation steps and cleaning steps as needed are covered, as shown by the arrow in FIG. 1 looping from step 22*g* back to 22*e*. Further, any masking steps that might be needed to allow oxidation and cleaning in selected areas are also included. Accordingly, the invention is not limited except as stated in the claims.

What is claimed is:

1. A method of processing a wafer, comprising:
   cleaning said wafer;
   growing an oxide on said wafer;
   cleaning said oxide;
   depositing additional oxide over said wafer; and
   providing a structure over said wafer, wherein said step of cleaning said wafer further comprises:
   wet cleaning said wafer; and
   subsequently vapor cleaning said wafer.

2. The method in claim 1, wherein said step of cleaning said oxide further comprises removing said oxide; and said step of depositing additional oxide over said wafer further comprises depositing additional oxide on said wafer.

3. The method in claim 2, wherein said step of cleaning said oxide further comprises vapor cleaning said oxide.

* * * * *